United States Patent
Li et al.

(10) Patent No.: US 8,852,968 B2
(45) Date of Patent: Oct. 7, 2014

(54) STI CMP UNDER POLISH MONITORING

(71) Applicants: Liang Li, Singapore (SG); Zheng Zou, Singapore (SG); Huang Liu, Singapore (SG); Alex See, Singapore (SG)

(72) Inventors: Liang Li, Singapore (SG); Zheng Zou, Singapore (SG); Huang Liu, Singapore (SG); Alex See, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 48 days.

(21) Appl. No.: 13/768,870

(22) Filed: Feb. 15, 2013

(65) Prior Publication Data

US 2014/0234993 A1 Aug. 21, 2014

(51) Int. Cl.
*H01L 21/66* (2006.01)

(52) U.S. Cl.
CPC ........................ *H01L 22/12* (2013.01)
USPC ........................................... 438/16

(58) Field of Classification Search
None
See application file for complete search history.

(56) References Cited

U.S. PATENT DOCUMENTS

| | | | | |
|---|---|---|---|---|
| 5,867,276 A * | 2/1999 | McNeil et al. | ............ | 356/445 |
| 6,885,446 B2 | 4/2005 | Machavariani et al. | | |
| 6,980,300 B1 * | 12/2005 | Lensing et al. | ............ | 356/601 |
| 7,171,284 B2 * | 1/2007 | Vuong et al. | ............ | 700/121 |
| 7,305,322 B2 * | 12/2007 | Funk et al. | ............ | 702/155 |
| 7,463,369 B2 * | 12/2008 | Wack et al. | ............ | 356/625 |
| 7,465,590 B1 * | 12/2008 | Feng et al. | ............ | 438/14 |
| 7,542,859 B2 * | 6/2009 | Funk et al. | ............ | 702/71 |
| 2010/0105288 A1 * | 4/2010 | David et al. | ............ | 451/5 |
| 2011/0216328 A1 * | 9/2011 | Kobayashi | ............ | 356/630 |

* cited by examiner

*Primary Examiner* — Scott B Geyer
(74) *Attorney, Agent, or Firm* — Ditthavong & Steiner, P.C.

(57) ABSTRACT

Methods of deducing oxide thickness using calculated and measured scattering spectra are provided. Embodiments include depositing an oxide over a semiconductor wafer, reducing the oxide from a portion of the semiconductor wafer, and deducing a thickness of oxide remaining at a location within the portion using scatterometric metrology. Embodiments further include deducing the thickness by: calculating scattering spectra for a plurality of oxide thicknesses, producing calculated scattering spectra, monitoring scattering spectra at the location within the portion of the semiconductor wafer, comparing the monitored scattering spectra at the location to the calculated scattering spectra, determining a closest matching calculated scattering spectra to the monitored scattering spectra at the location, and obtaining an oxide thickness corresponding to the closest matching calculated scattering spectra.

17 Claims, 5 Drawing Sheets

STI CMP UNDER POLISH MONITORING

TECHNICAL FIELD

The present disclosure relates to methods of forming semiconductor devices including chemical mechanical polishing (CMP) of oxide layers. The present disclosure is particularly applicable to the formation of semiconductor devices including CMP of shallow trench isolation (STI) region oxide.

BACKGROUND

Under polishing and over polishing are issues often seen in CMP processes. Under and over polishing can occur in center or edge dies and in both static random access memories (SRAMs) and in dummy structures. FIG. 1A illustrates a substrate 101 after a high aspect ratio process oxide (HARP) 103 is deposited in a trench for a STI region and over pad nitride 105 and pad oxide 107. Post STI CMP or hydrogen fluoride (HF) deglaze, in an ideal case, no oxide remains over the pad nitride 105, as illustrated in FIG. 1B. Then, pad nitride 105 may be removed by wet nitride removal, resulting in the structure shown in FIG. 1C. However, adverting to FIG. 1D, when under polishing occurs, a thin film of oxide 103' remains on top of pad nitride 105. Consequently, during the wet nitride removal process the nitride is shielded from the etchants and cannot be removed. The wafer is therefore defective, resulting in yield loss.

Due to the unavailability of suitable metrology, under polishing is not detectable until the wet nitride removal defect scan post nitride removal, at which point rework of the problematic wafers becomes impossible. Known methodology for monitoring remaining oxide involves using an optical ellipsometer to measure film thickness on top of a solid pad based on interference, and inferring the presence of residual oxide in the cell area. However, it has been found that there is no strong correlation between the presence of residual oxide in the cell area and the relevant thickness on the measurement solid pad, since the cell area is located in a dense area whereas the solid pad is an isolated pad. When using HARP for STI, the conformal deposition yields a particularly thick layer over dense areas, resulting in even less of a correlation between the presence of residual oxide in the cell area and the thickness on the measurement pad.

In addition, the result of the pad structure post CMP measurement could also be affected by up stream processes. For example, reactive ion etching (RIE) of the STI trench, the HARP deposition and the resulting thicknesses in the trench, above the trench, and over the pad nitride, the pad nitride thickness, etc., all could affect CMP performance assessment. Further, there is only one solid pad proxy for such a measurement, with a maximum measurable area having a radius of 140 millimeters (mm), with edge areas omitted. Therefore, it is impossible to obtain a full picture of the wafer condition, especially when the field is large.

Phase modulation has traditionally been employed for topography measurement. However, phase modulation is only applicable for micron level pattern measurements and, therefore, cannot report oxide residue thickness.

A need therefore exists for methodology enabling direct measurement of residual oxide on dense structures, with no limitation on pattern size, and feedback for adjusting polishing time.

SUMMARY

An aspect of the present disclosure is a method including deducing an oxide thickness using scatterometric metrology.

Another aspect of the present disclosure is method including reducing an oxide layer thickness, measuring scattering spectra of the reduced oxide layer, obtaining an oxide thickness associated with a calculated scattering spectra that matches the measured scattering spectra, and repeating the steps until the obtained thickness reaches zero.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: depositing an oxide over a semiconductor wafer; reducing the oxide from a portion of the semiconductor wafer; and deducing a thickness of oxide remaining at a location within the portion using scatterometric metrology.

Aspects of the present disclosure include deducing the thickness by: calculating scattering spectra for a plurality of oxide thicknesses, producing calculated scattering spectra; monitoring scattering spectra at the location within the portion of the semiconductor wafer; comparing the monitored scattering spectra at the location to the calculated scattering spectra; determining a closest matching calculated scattering spectra to the monitored scattering spectra at the location; and obtaining an oxide thickness corresponding to the closest matching calculated scattering spectra. Further aspects include reducing the oxide by performing CMP above a pad nitride layer proximate an STI region. Other aspects include the oxide including HARP oxide. Another aspect includes increasing a time for CMP based on a deduced thickness of remaining oxide greater than zero. An additional aspect includes repeating the steps of increasing a time for CMP and deducing a thickness until the deduced thickness is zero. Further aspects include reducing the oxide comprises HF deglazing. Another aspect includes the location being within a SRAM portion on the semiconductor wafer. Other aspects include the location being over dummy structures formed on the semiconductor wafer. Additional aspects include: monitoring scattering spectra at one to ten locations per die of the semiconductor wafer; comparing the monitored scattering spectra at each location to the calculated scattering spectra; determining a closest matching calculated scattering spectra to the monitored scattering spectra at each location; and obtaining an oxide thickness corresponding to the closest matching calculated scattering spectra for each location.

Another aspect of the present disclosure is a method comprising: calculating scattering spectra for each of a plurality of oxide thicknesses, producing calculated scattering spectra; associating the scattering spectra with the corresponding oxide thickness; creating a library of scattering spectra and associated oxide thicknesses; providing an oxide layer on a semiconductor wafer; reducing a thickness of the oxide layer on a portion of the semiconductor wafer, forming a reduced oxide layer; measuring scattering spectra of the reduced oxide layer; accessing the library of scattering spectra; determining a calculated scattering spectra that matches the measured scattering spectra of the reduced oxide layer; obtaining the associated oxide thickness of the calculated scattering spectra that matches the measured scattering spectra of the reduced oxide layer; and repeating the steps of reducing, measuring, accessing, determining, and obtaining until the obtained oxide thickness is zero.

Aspects include reducing the thickness of the oxide by performing CMP above a pad nitride layer proximate a STI region. Other aspects include the oxide including a HARP oxide. Further aspects include measuring scattering spectra within a SRAM portion on the semiconductor wafer. An additional aspect includes measuring scattering spectra over dummy structures formed on the semiconductor wafer.

Another aspect of the present disclosure is a method including: calculating scattering spectra for each of a plurality of oxide thicknesses, producing calculated scattering spectra; associating the scattering spectra with the corresponding oxide thickness; creating a library of scattering spectra and associated oxide thicknesses; providing an oxide layer on a semiconductor wafer; reducing a thickness of the oxide layer on a portion of the semiconductor wafer, forming a reduced oxide layer; measuring scattering spectra of the reduced oxide layer at multiple locations across the portion of the semiconductor wafer; accessing the library of scattering spectra; determining a calculated scattering spectra that matches the measured scattering spectra of the reduced oxide layer at each of the multiple locations; obtaining the associated oxide thickness of each calculated scattering spectra that matches a measured scattering spectra of the reduced oxide layer; obtaining the associated oxide thickness of the calculated scattering spectra that matches each measured scattering spectra of the reduced oxide layer; identifying a zone in which an obtained oxide thickness is greater than zero; reworking the identified zone; and repeating the steps of measuring, accessing, determining, and obtaining until no obtained oxide thickness is greater than zero.

Aspects include measuring the scattering spectra of the reduced oxide layer at up to 10 locations per die on the wafer. Further aspects include reducing the oxide thickness by CMP. Another aspect includes the oxide layer including a HARP oxide. An additional aspect includes measuring scattering spectra within a SRAM portion on the semiconductor wafer or over dummy structures formed on the semiconductor wafer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of wafer yield loss attendant upon under polishing HARP in the formation of STI regions and an inability to measure the residual oxide prior to wet nitride removal. In accordance with embodiments of the present disclosure, scatterometric metrology is used to detect possible oxide residue in dense areas, and feedback is sent to the polishing tool to rework the wafer or wafer lot prior to wet nitride removal.

Methodology in accordance with embodiments of the present disclosure includes depositing an oxide over a semiconductor wafer, reducing the oxide from a portion of the semiconductor wafer, and deducing a thickness of oxide remaining at a location within the portion using scatterometric metrology. More specifically, the thickness is deduced by: calculating scattering spectra for a plurality of oxide thicknesses, producing calculated scattering spectra, monitoring scattering spectra at the location within the portion of the semiconductor wafer, comparing the monitored scattering spectra at the location to the calculated scattering spectra, determining a closest matching calculated scattering spectra to the monitored scattering spectra at the location, and obtaining an oxide thickness corresponding to the closest matching calculated scattering spectra.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

When residual oxide is found via optical review of wafers post oxide STI CMP, questions arise as to the thickness of the residue, whether the wafer lot should be sent for rework, if sent for rework whether the rework is sufficient, and can it be insured that the rework is enough? The only way to answer the questions is to be able to measure the thickness of the residue in dense areas.

Figure 1A:
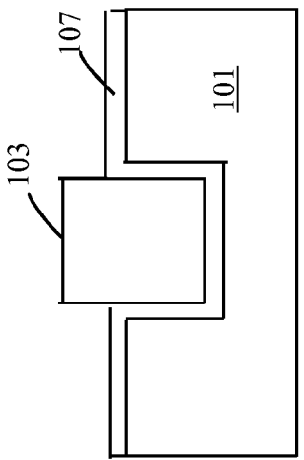
FIGS. 1A through 1C schematically illustrates an ideal process for forming an STI region, and FIG. 1D schematically illustrates the result of under polishing the STI.
Figure 1B:
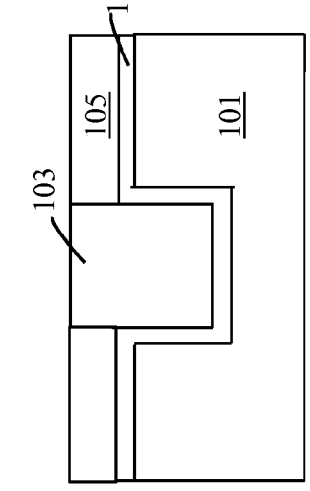
Figure 1C:
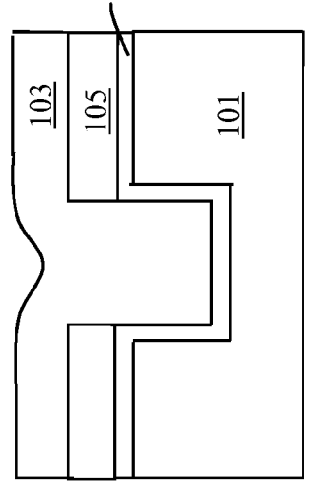
Figure 1D:
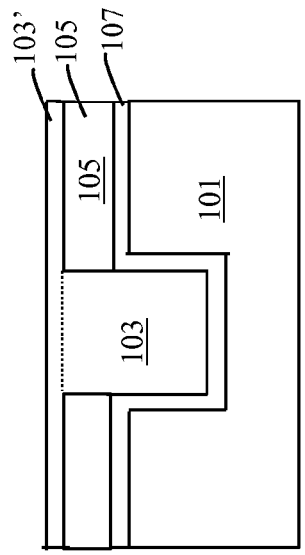
Figure 2:
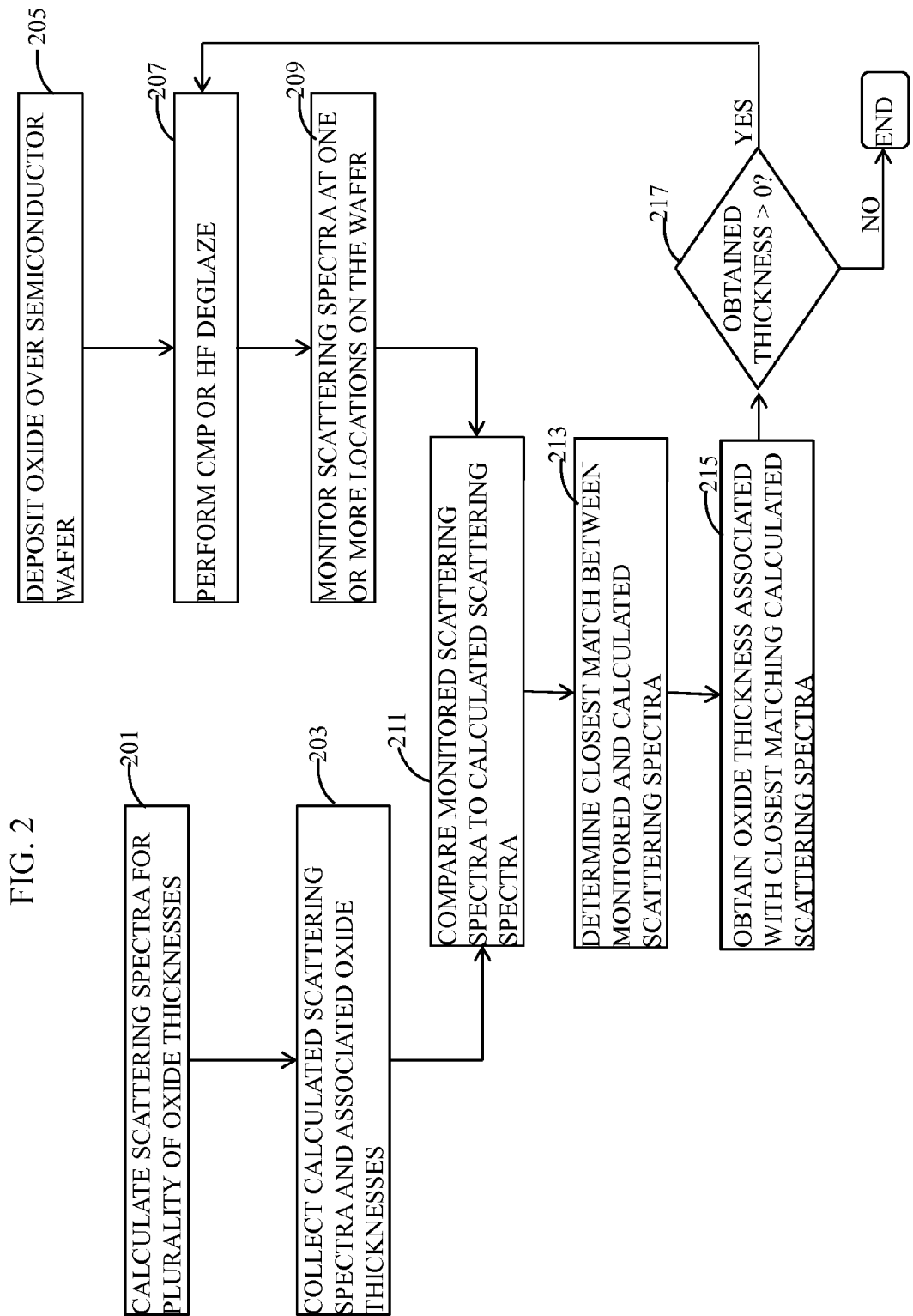
FIG. 2 illustrates a process flow for directly measuring residual oxide, in accordance with an exemplary embodiment.

It is known that different oxide patterns produce different scattering spectra. Therefore, for a given thickness, theoretical scattering spectra can be calculated. Adverting to FIG. 2, a process flow for directly measuring residual oxide in cell areas of a wafer is shown, in accordance with an exemplary embodiment of the present disclosure. As illustrated at step 201, theoretical scattering spectra is calculated for each of a plurality of oxide thicknesses. The calculated scattering spectra are then associated with the respective oxide thicknesses and collected or stored, for example in a library, at step 203.

For a given wafer, in step 205, an oxide layer, such as oxide layer 103 (described with respect to FIGS. 1A through 1D), is deposited, such as over pad nitride layer 105 proximate an STI region. CMP or HF deglazing is performed at step 207 to remove the oxide from pad nitride layer 105. In step 209, scattering spectra are monitored at one or more locations on the wafer, for example 1 to 10 sites per die. The number of sites will depend on the size of the die or field and whether more or less data is desired for the wafer. Measurement sites may be inside the die or on scrub lines between dies, within an SRAM on the semiconductor wafer or over dummy structures formed on the wafer.

Adverting to step 211, the monitored scattering spectra may then be compared to calculated scattering spectra collected at step 203 to find the closest match. Once a closest match has been determined (step 213), the thickness of the remaining oxide layer can be deduced by obtaining the thickness associated with the closest matching calculated scattering spectra (step 215). A determination may be made at step 217 as to whether the obtained thickness is still greater than zero, and if so, steps 207 through 217 may be repeated. Further, the time for CMP may be increased for subsequent wafers based on a deduced thickness greater than zero.

Figure 3:
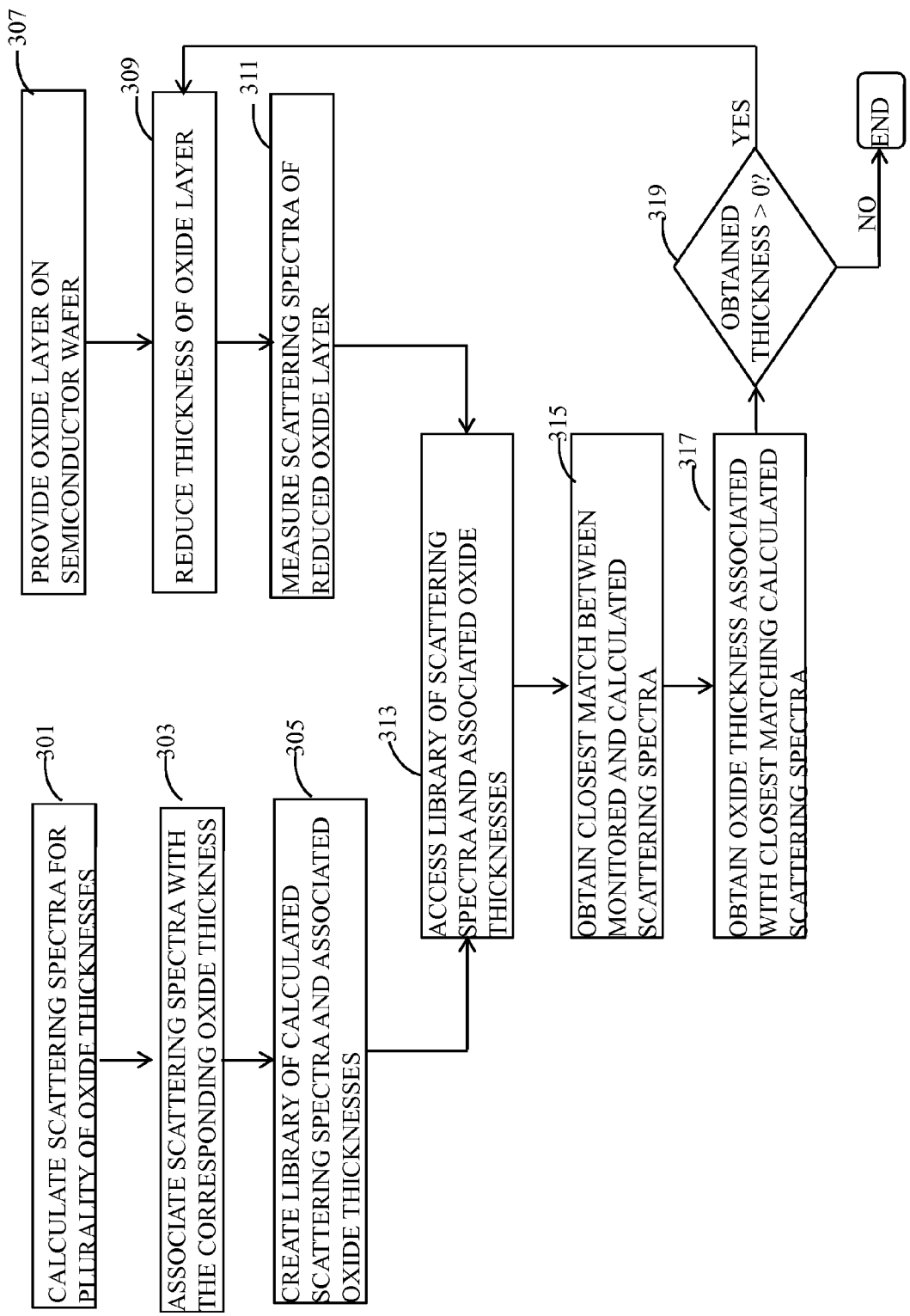
FIG. 3 illustrates a process flow for directly measuring residual oxide, in accordance with another exemplary embodiment.

FIG. 3 shows a process flow in accordance with another exemplary embodiment. Adverting to step 301, theoretical scattering spectra is calculated for each of a plurality of oxide thicknesses. The calculated scattering spectra are then associated with the corresponding oxide thicknesses in step 303, and a library is created of the calculated scattering spectra and the associated oxide thicknesses in step 305.

In step 307, an oxide layer, such as oxide layer 103 (described with respect to FIGS. 1A through 1D), is provided on a semiconductor wafer, such as over pad nitride layer 105. The thickness of the oxide layer is reduced, e.g. by CMP or HF deglazing, at step 309 to remove the oxide from pad nitride layer 105. In step 311, scattering spectra are measured at one or more locations on the wafer, for example 1 to 10 sites per die. The number of sites will depend on the size of the die or field and whether more or less data is desired for the wafer. Measurement sites may be inside the die or on scrub lines between dies, within an SRAM on the semiconductor wafer or over dummy structures formed on the wafer.

Adverting to step 313, the library is accessed, and measured scattering spectra may then be compared to calculated scattering spectra to obtain the closest match (step 315). Once a closest match has been determined, the thickness of the remaining oxide layer can be deduced by obtaining the thickness associated with the closest matching calculated scattering spectra (step 317).

At step 319, a determination is made as to whether the obtained thickness is greater than zero. If the thickness associated with the closest match is zero, then the process ceases. If, however, the thickness is greater than zero, oxide remains on the pad nitride and must be removed. Accordingly, steps 309 through 319 are repeated until a thickness of zero is obtained at step 317.

Figure 4:
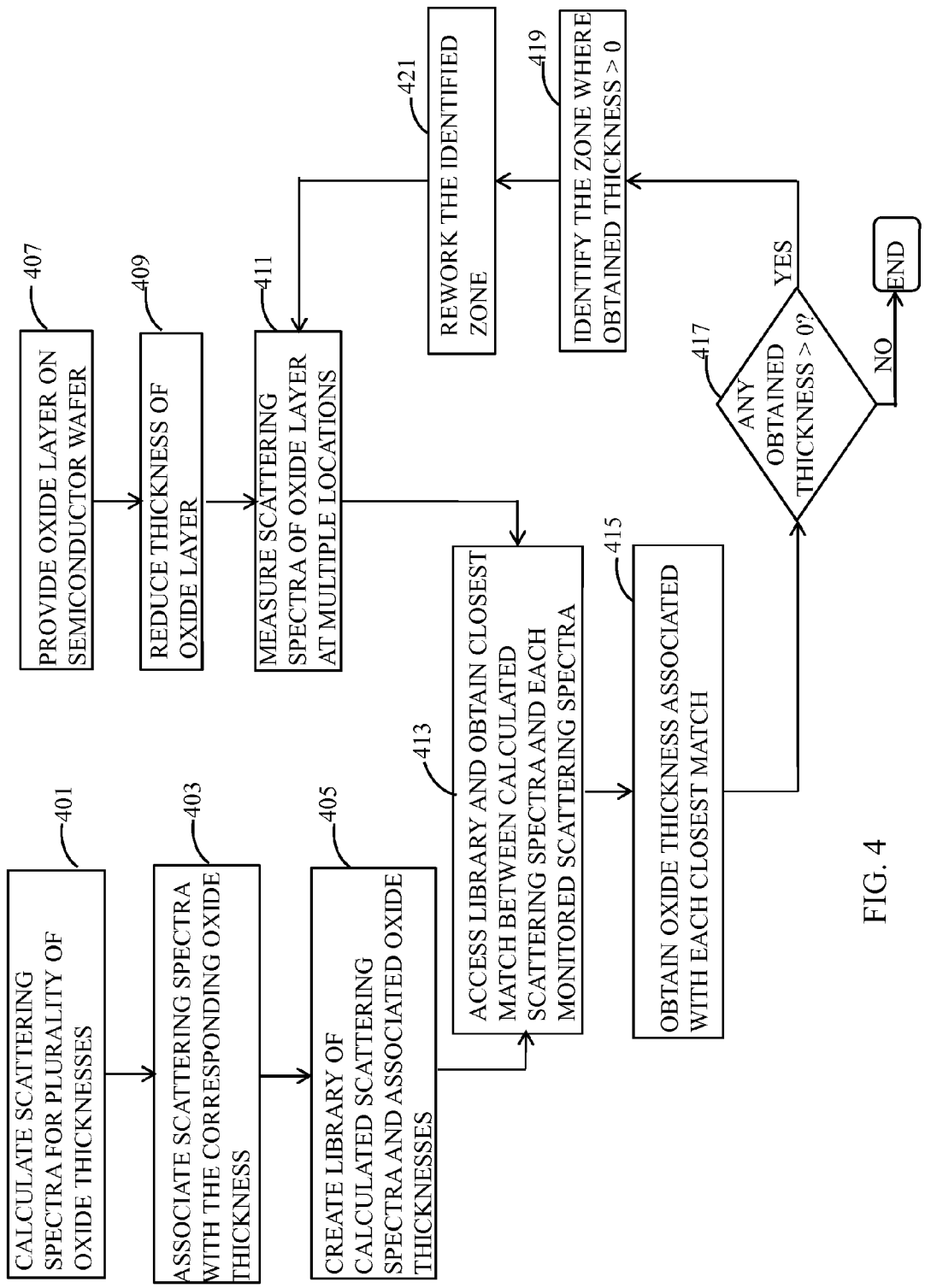
FIG. 4 illustrates a process flow for directly measuring residual oxide, in accordance with another exemplary embodiment.

FIG. 4 shows a process flow in accordance with another exemplary embodiment. Adverting to step 401, theoretical scattering spectra is calculated for each of a plurality of oxide thicknesses. The calculated scattering spectra are then associated with the corresponding oxide thicknesses in step 403, and a library is created of the calculated scattering spectra and the associated oxide thicknesses in step 405.

In step 407, an oxide layer, such as oxide layer 103 (described with respect to FIGS. 1A through 1D), is provided on a semiconductor wafer, such as over pad nitride layer 105. The thickness of the oxide layer is reduced, e.g. by CMP or HF deglazing, at step 409 to remove the oxide from pad nitride layer 105. In step 411, scattering spectra are measured multiple locations on the wafer, for example 1 to 10 sites per die. The number of sites will depend on the size of the die or field and whether more or less data is desired for the wafer. Measurement sites may be inside the die or on scrub lines between dies, within an SRAM on the semiconductor wafer or over dummy structures formed on the wafer.

Adverting to step 413, the library is accessed, and each measured scattering spectra may then be compared to calculated scattering spectra to obtain the closest match. The thickness of the remaining oxide layer can be deduced at each measurement point by obtaining the thickness associated with each closest matching scattering spectra (step 415).

At step 417, a determination is made as to whether any obtained thicknesses are greater than zero. If an obtained thickness associated with each closest match is zero, then the process ceases. If, however, a thickness is greater than zero, underpolishing has occurred, and oxide remains on the pad nitride and must be removed. Accordingly, at step 419, the zone (i.e., the center of the wafer, the edge of the wafer, or in an area between the center and the edge) where a non-zero thickness has been obtained is identified. A rework in the identified zone may then be performed at step 421. For example, a rework recipe may be selected, and pressure may be applied in the identified zone to remove more oxide. Next, steps 411 through 421 are repeated until no obtained thicknesses are greater than zero at step 417.

Figure 5:
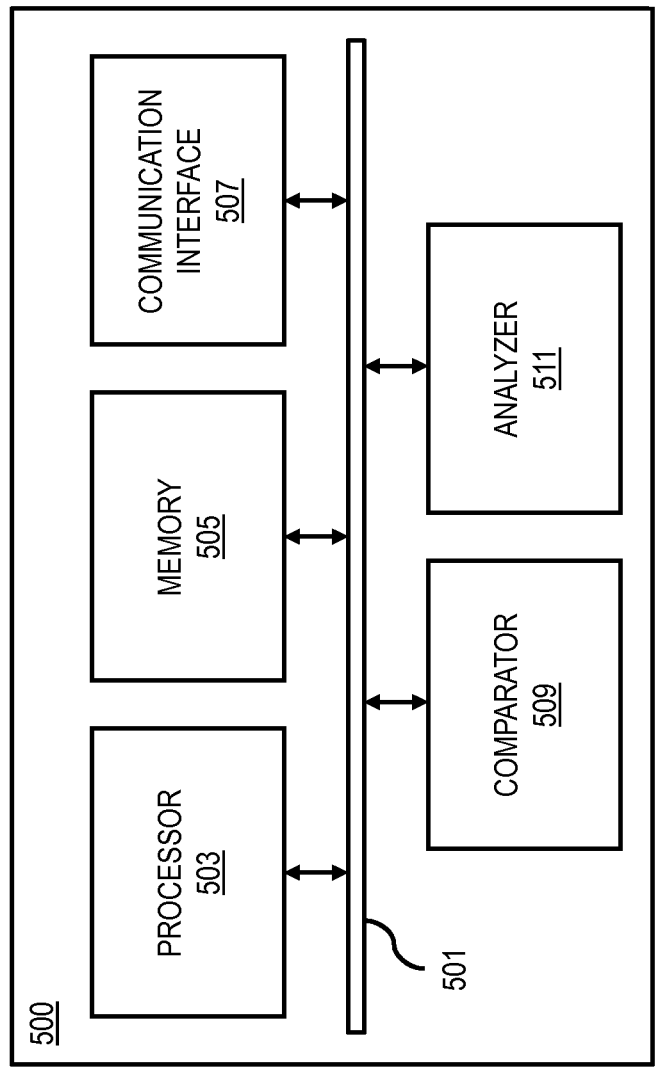
FIG. 5 schematically illustrates a computer system upon which exemplary embodiments of the invention may be implemented.

FIG. 5 schematically illustrates a computer system 500 upon which an exemplary embodiment of the invention may be implemented. Computer system 500 may, for instance, be programmed (e.g., via computer program code or instructions) to calculate scattering spectra for a plurality of oxide thicknesses and compare measured scattering spectra to the calculated scattering spectra, as described herein and may include a communication mechanism such as a bus 501 for passing information between other internal and external components of the computer system 500. Moreover, computer system 500 may include a processor (or multiple processors) 503 for performing a set of operations on information as specified by computer program code related to calculating scattering spectra for a plurality of oxide thicknesses and comparing measured scattering spectra to the calculated scattering spectra. Computer system 500 may also include memory 505 coupled to bus 501. The memory 505 may, for instance, include dynamic storage, static storage, or a combination thereof for storing calculated scattering spectra and associated oxide thicknesses.

Processor 503 may perform a scatterometry measurement on a reduced oxide layer and may thereafter generate spectra for each measurement. By way of example, based on computer program code in memory 505, processor 503 may interact with communication interface 507 and may then work with comparator 509 to compare stored calculated scattering spectra with the measured scattering spectra. Comparator 509 may then provide the results to analyzer 511 and direct analyzer 511 to determine whether further CMP or HF deglazing is necessary for the oxide layer.

It is noted that, in various aspects, some or all of the techniques described herein are performed by computer system 500 in response to processor 503 executing one or more sequences of one or more processor instructions contained in memory 505. Such instructions, also called computer instructions, software and program code, may be read into memory 505 from another computer-readable medium such as a storage device or a network link. Execution of the sequences of instructions contained in memory 505 causes processor 503 to perform one or more of the method steps described herein. In alternative embodiments, hardware, such as application-specific integrated circuits (ASICs), may be used in place of or in combination with software to implement the invention. Thus, embodiments of the invention are not limited to any specific combination of hardware and software, unless otherwise explicitly stated herein.

The embodiments of the present disclosure can achieve several technical effects including direct measurement of residual oxide on dense structures, with no limitation on pattern size, and feedback for adjusting polishing time. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   depositing an oxide over a semiconductor wafer;
   reducing the oxide from a portion of the semiconductor wafer by performing chemical mechanical polishing (CMP) above a pad nitride layer proximate a shallow trench isolation (STI) region; and
   deducing a thickness of oxide remaining at a location within the portion using scatterometric metrology.

2. The method according to claim 1, comprising deducing the thickness by:
   calculating scattering spectra for a plurality of oxide thicknesses, producing calculated scattering spectra;
   monitoring scattering spectra at the location within the portion of the semiconductor wafer;
   comparing the monitored scattering spectra at the location to the calculated scattering spectra;
   determining a closest matching calculated scattering spectra to the monitored scattering spectra at the location; and
   obtaining an oxide thickness corresponding to the closest matching calculated scattering spectra.

3. The method according to claim 2, wherein reducing the oxide comprises hydrogen fluoride (HF) deglazing.

4. The method according to claim 2, wherein the location is within a static random access memory (SRAM) portion on the semiconductor wafer.

5. The method according to claim 2, wherein the location is over dummy structures formed on the semiconductor wafer.

6. The method according to claim 2, comprising:
   monitoring scattering spectra at one to ten locations per die of the semiconductor wafer;
   comparing the monitored scattering spectra at each location to the calculated scattering spectra;
   determining a closest matching calculated scattering spectra to the monitored scattering spectra at each location; and
   obtaining an oxide thickness corresponding to the closest matching calculated scattering spectra for each location.

7. The method according to claim 1, wherein the oxide comprises a high aspect ratio process (HARP) oxide.

8. The method according to claim 1, further comprising increasing a time for CMP based on a deduced thickness of remaining oxide greater than zero.

9. The method according to claim 8, comprising repeating the steps of increasing a time for CMP and deducing a thickness until the deduced thickness is zero.

10. A method comprising:
    calculating scattering spectra for each of a plurality of oxide thicknesses, producing calculated scattering spectra;
    associating the scattering spectra with the corresponding oxide thickness;
    creating a library of scattering spectra and associated oxide thicknesses;
    providing an oxide layer on a semiconductor wafer;
    reducing a thickness of the oxide layer on a portion of the semiconductor wafer, forming a reduced oxide layer, wherein reducing the thickness of the oxide comprises performing chemical mechanical polishing (CMP) above a pad nitride layer proximate a shallow trench isolation (STI) region;
    measuring scattering spectra of the reduced oxide layer;
    accessing the library of scattering spectra;
    determining a calculated scattering spectra that matches the measured scattering spectra of the reduced oxide layer;
    obtaining the associated oxide thickness of the calculated scattering spectra that matches the measured scattering spectra of the reduced oxide layer; and
    repeating the steps of reducing, measuring, accessing, determining, and obtaining until the obtained oxide thickness is zero.

11. The method according to claim 10, wherein the oxide comprises a high aspect ratio process (HARP) oxide.

12. The method according to claim 10, comprising measuring scattering spectra within a static random access memory (SRAM) portion on the semiconductor wafer.

13. The method according to claim 10, comprising measuring scattering spectra over dummy structures formed on the semiconductor wafer.

14. A method comprising:
    calculating scattering spectra for each of a plurality of oxide thicknesses, producing calculated scattering spectra;
    associating the scattering spectra with the corresponding oxide thickness;
    creating a library of scattering spectra and associated oxide thicknesses;
    providing an oxide layer on a semiconductor wafer;
    reducing a thickness of the oxide layer on a portion of the semiconductor wafer, forming a reduced oxide layer;
    measuring scattering spectra of the reduced oxide layer at up to 10 locations per die across the portion of the semiconductor wafer;
    accessing the library of scattering spectra;
    determining a calculated scattering spectra that matches the measured scattering spectra of the reduced oxide layer at each of the multiple locations;

obtaining the associated oxide thickness of each calculated scattering spectra that matches a measured scattering spectra of the reduced oxide layer;

identifying a zone in which an obtained oxide thickness is greater than zero;

reworking the identified zone; and repeating the steps of measuring, accessing, determining, and obtaining until no obtained oxide thickness is greater than zero.

15. The method according to claim 14, comprising reducing the oxide thickness by chemical mechanical polishing (CMP).

16. The method according to claim 14, wherein the oxide layer comprises a high aspect ratio process (HARP) oxide.

17. The method according to claim 14, comprising measuring scattering spectra within a static random access memory (SRAM) portion on the semiconductor wafer or over dummy structures formed on the semiconductor wafer.

* * * * *